United States Patent [19]
Ahn et al.

[11] Patent Number: 5,346,854
[45] Date of Patent: Sep. 13, 1994

[54] METHOD OF MAKING A SEMICONDUCTOR LASER

[75] Inventors: Hyung S. Ahn, Anyang; Won T. Choi, Seoul, both of Rep. of Korea

[73] Assignee: Goldstar Co., Ltd., Seoul, Rep. of Korea

[21] Appl. No.: 972,015

[22] Filed: Nov. 6, 1992

[30] Foreign Application Priority Data

Nov. 7, 1991 [KR] Rep. of Korea ............... 19770/1991

[51] Int. Cl.$^5$ ............................................. H01L 21/20
[52] U.S. Cl. ................................. 437/129; 437/126; 437/130; 437/133; 437/228; 372/43; 372/45
[58] Field of Search ................. 372/43, 45, 50; 437/129, 126, 133, 130, 228

[56] References Cited

U.S. PATENT DOCUMENTS

| 4,675,074 | 6/1987 | Wada et al. | 156/647 |
| 4,731,344 | 3/1988 | Canning et al. | 437/129 |
| 5,159,603 | 10/1992 | Kim | 372/45 |

FOREIGN PATENT DOCUMENTS

| 0162896 | 12/1981 | Japan | 437/129 |
| 0155981 | 9/1984 | Japan | 437/129 |
| 0220985 | 12/1984 | Japan | 437/129 |
| 2042532 | 2/1987 | Japan | 437/129 |
| 0210842 | 8/1990 | Japan | 437/129 |
| 0257691 | 10/1990 | Japan | 372/45 |

Primary Examiner—R. Bruce Breneman
Assistant Examiner—Ramamohan Rao Paladugu
Attorney, Agent, or Firm—Finnegan, Henderson, Farabow, Garrett & Dunner

[57] ABSTRACT

A semiconductor laser including a compound semiconductor substrate of an n-type, a semiconductor laser chip region defined at a center portion of an upper portion of the compound semiconductor substrate and provided at its front and rear surfaces with mirror surfaces for oscillating laser beams, and a pair of guide regions defined at opposite sides of the chip region, respectively, to be in contact with the semiconductor laser chip region. The chip region has a shape of a hexahedron. Together with the front and rear surfaces of the chip region, the guide regions define a cavity for coupling the chip region with external elements at the compound semiconductor substrate. The semiconductor laser also includes a first electrode formed over the chip region and guide regions and adapted to receive an electric power for generating laser beams and a second electrode formed beneath the semiconductor substrate and adapted to receive the electric power for generating laser beams, together with the first electrode.

19 Claims, 10 Drawing Sheets

METHOD OF MAKING A SEMICONDUCTOR LASER

BACKGROUND OF THE INVENTION

1. Field of the Invention

The present invention relates to a semiconductor laser and a method for manufacturing the same.

2. Description of the Prior Art

The operational principle of semiconductor lasers and the construction of a conventional semiconductor laser will be described.

Semiconductor lasers are made of a compound semiconductor such as GaAs or InP which has a direct transition-type energy band structure. As voltage is forwardly applied to a p-n junction of such a semiconductor, current flows through the semiconductor. This current flow causes electrons in the n-type region and holes in the p-type region to flow toward the opposite regions to recombine together, and thus, to emit light.

Figure 1:
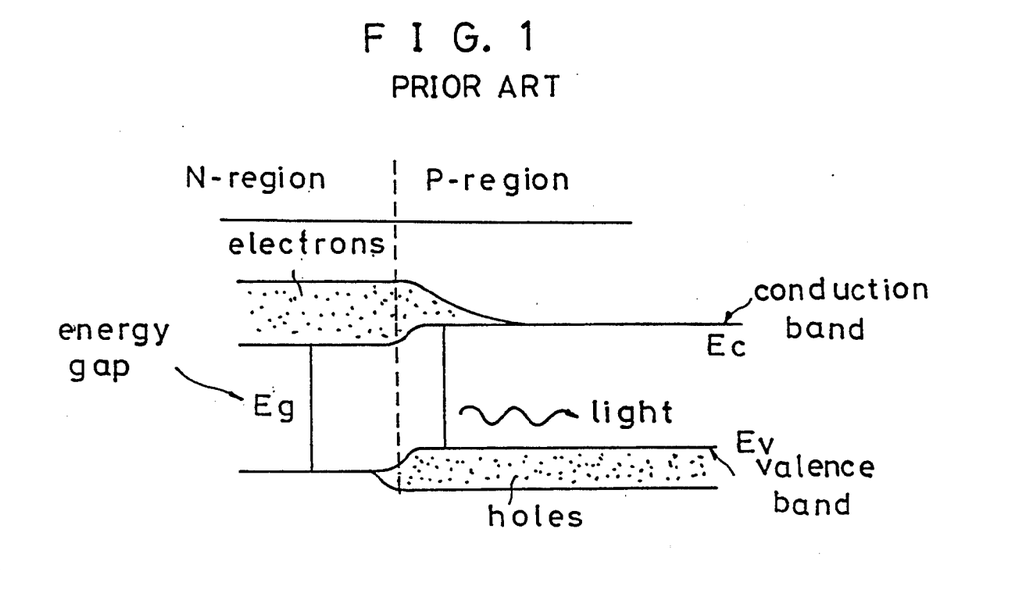
FIG. 1 is a schematic: view for explaining the principle of a semiconductor laser.

At a small quantity of current flow, the recombination of electrons and holes are achieved irregularly. As a result, induced emission of light required for operating the semiconductor laser is not achieved since resultant optical waves have no correlation with one another. At a large quantity of current flow, however, an inverted electron distribution is formed near the p-n junction, as shown in FIG. 1. The inverted electron distribution means that more electrons at a higher energy level are distributed over a lower energy level. At such an inverted electron distribution, light emission is induced by virtue of the electron-hole recombination. In this case, the region at which the induced emission of light caused by the inverted electron distribution is called an active region or a gain region.

As a gain larger than a loss of a resonator is generated upon an increase in applied current, the laser is oscillated. The current providing the gain required for oscillating the laser is called a threshold current which is an important factor for determining the performance and the application condition of a semiconductor laser.

In a semiconductor laser, the resonator for obtaining the oscillation of optical waves uses mainly the crystal sectional surfaces (namely, the surfaces of cleavage) of the semiconductor itself.

An efficient structure capable of reducing the threshold current in the semiconductor laser is described below. If the recombination of carriers (electrons and holes) occurs at a region of no inverted electron distribution, that is, out of a gain region, the light emitted due to the recombination cannot contribute to the induced emission.

In such a double hetero (DH) structure, an active layer (GaAs) having a small energy gap is interposed between clad layers (GaAlAs) having a large energy gap. An example of a semiconductor laser having such a DH structure is a simple diode in which its one heterojunction is a p-n junction. As current flows forward through the diode, the holes in the n-type clad layer flow into and are then implanted in the active region.

Figure 2:
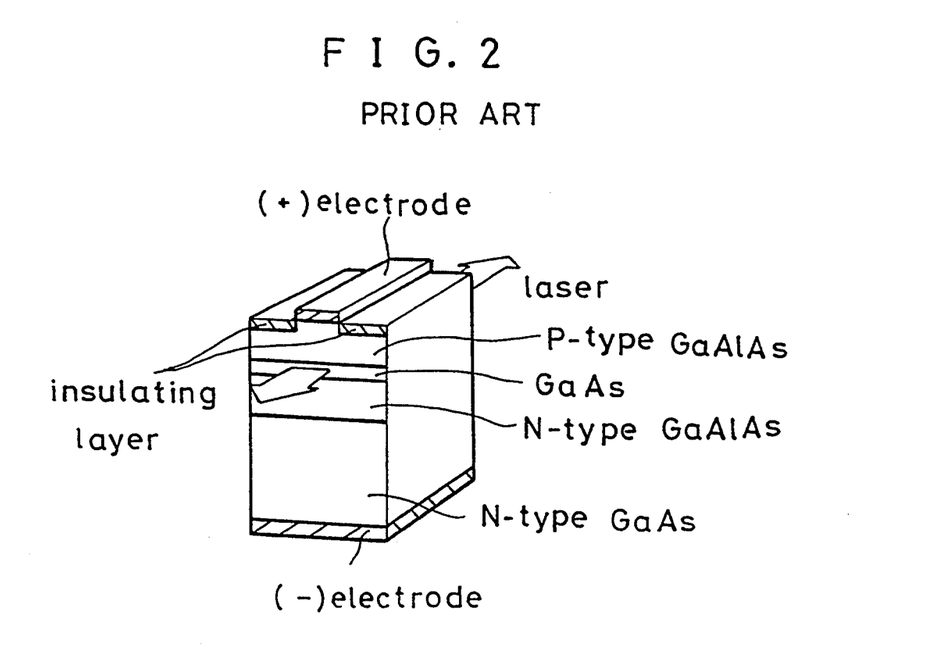
FIG. 2 is a perspective view of a semiconductor laser having a conventional DH structure.

Since the active layer has a small band gap as shown in FIG. 2, the clad layers disposed at opposite surfaces of the active layer form energy barriers which function to restrain implanted carriers in the active region. Accordingly, the density of carriers in the thin active region is very high and the recombination of carriers for emitting light is mainly achieved in the active layer.

The refractive index of GaAs constituting the active layer is higher than that of GaAlAs constituting the clad layers. Light concentrates in a region having a large refractive index. Accordingly, in the DH structure, light is focused on the active layer. Hence, densities of carriers and optical waves in the active layer are very high, thereby enabling the threshold current to be reduced.

Furthermore, the threshold current can be lowered further by restraining the carriers and the optical waves in the narrow active region in a direction perpendicular to the active layer.

A metal electrode having a narrow strip shape is formed as shown in FIG. 2 to control the current flow. As shown in FIG. 2, opposite side surfaces of the metal electrode are formed roughly to prevent light concentration. Such a structure is called a strip-type hetero structure. It is often called a gain transmission-type structure since light is guided to a gain region in which the density of carriers is high.

Figure 3:
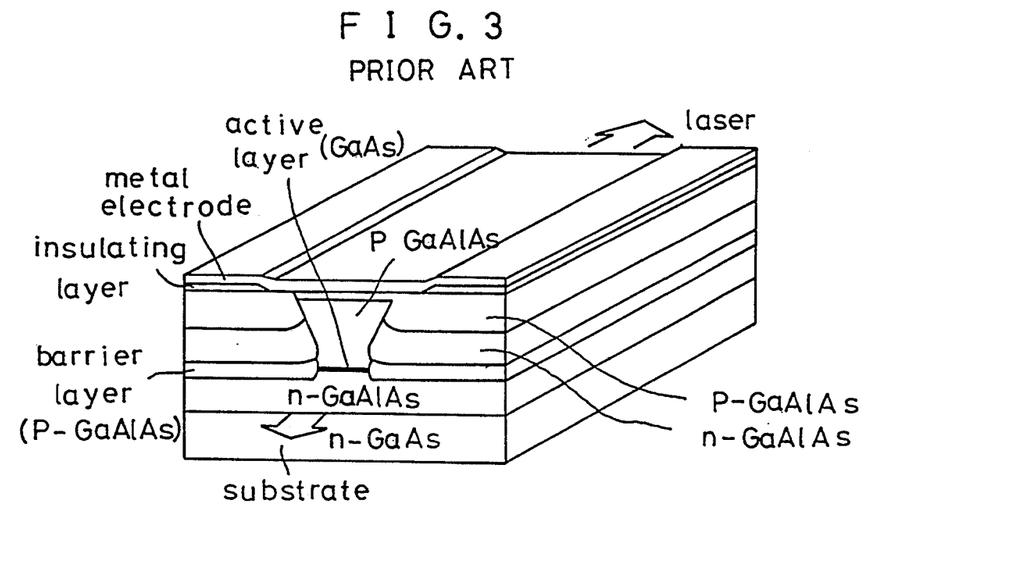
FIG. 3 is a perspective view of a semiconductor laser having a conventional buried type DH structure.

In addition, there is a method for restraining optical waves in a direction parallel to the active layer. FIG. 3 shows a buried type hetero structure which is commonly used in communication lasers. As shown in FIG. 3, the structure has a shape in which a GaAs active layer is surrounded at its opposite sides by n-type GaAlAs layers.

As above-mentioned, the GaAs layer forms a waveguide path since it is surrounded at its upper, lower, left and right portions by the GaAlAs layers having a refractive index lower than that of the GaAs layer.

As shown in FIG. 3, opposite side surfaces of the waveguide are formed roughly to prevent light concentration. This type of waveguide is called the refractive index waveguide.

Such a DH structure has an advantage of having a low threshold current. Also, it has a stable oscillation transverse mode characteristic and is advantageous for communication and information processing applications.

Figure 4:
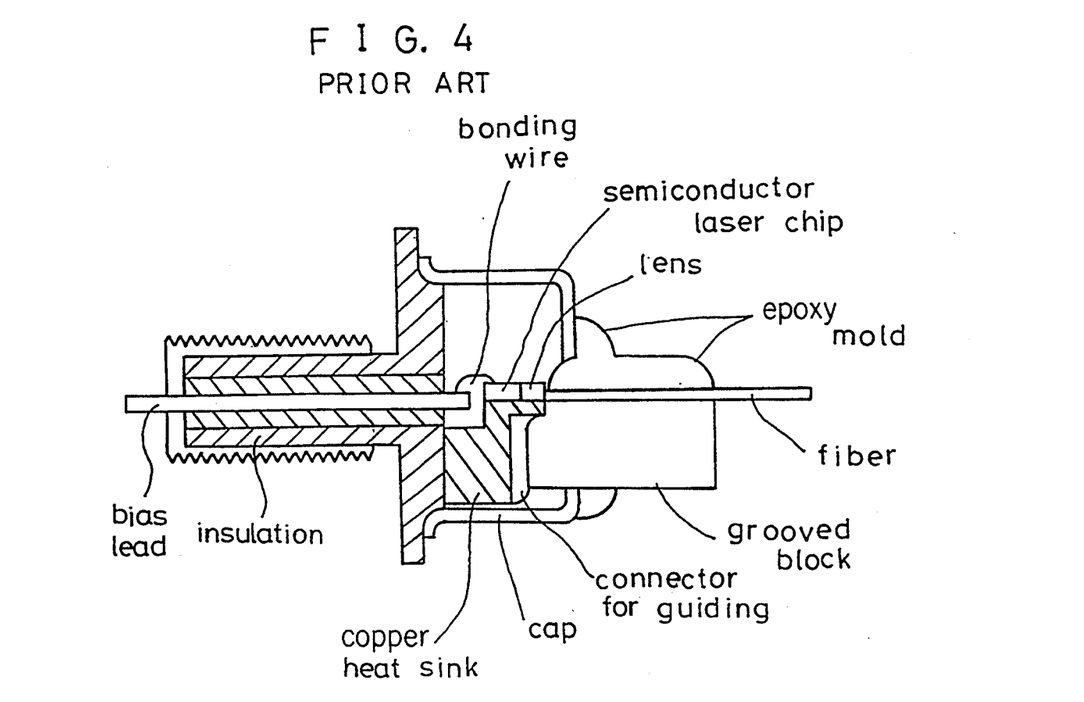
FIG. 4 is a schematic view of a conventional semiconductor laser device.
Figure 5:
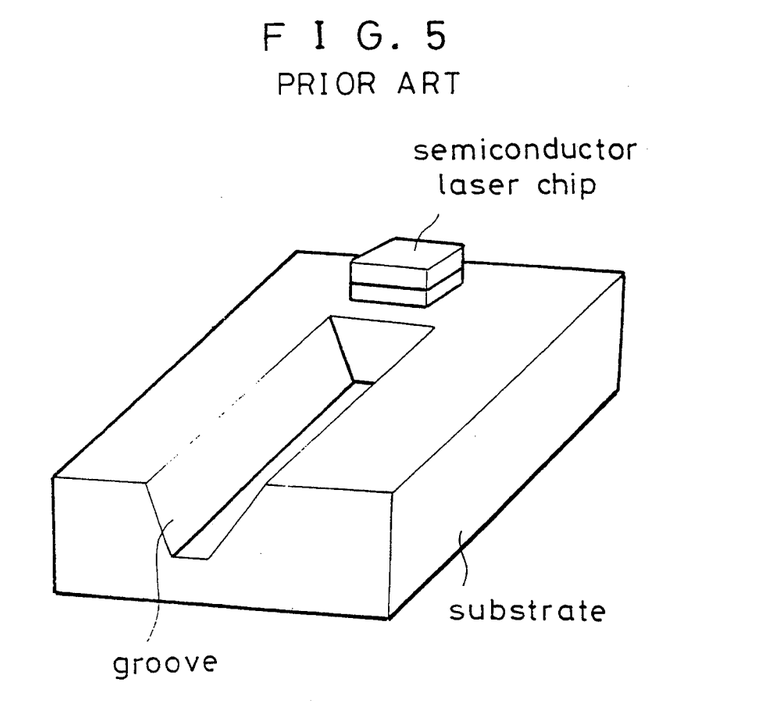
FIG. 5 is a schematic: view of another conventional semiconductor laser device.

Now, problems encountered in the conventional semiconductor lasers shown in FIGS. 2 and 3 will be described in conjunction with semiconductor laser devices which are equipped with the conventional semiconductor lasers and which are shown in FIGS. 4 and 5, respectively.

First, the semiconductor laser device shown in FIG. 4 will be described. In manufacturing the semiconductor laser device, a semiconductor laser chip is attached to one side portion of a cylindrical heat sink plate, as shown in FIG. 4. The semiconductor laser chip is coupled with external elements, such as a light receiving element and an optical communication cable, by means of a grooved block separately provided at one side portion of the semiconductor laser. The contact portions between the semiconductor laser and the block are molded for preventing laser beams from escaping.

However, it is very difficult to couple the semiconductor laser chip with the optical cable by means of the block. Furthermore, the semiconductor laser device shown in FIG. 4 can process only one signal from a single line and has a relatively large size. As a result, it is impossible to integrate a plurality of semiconductor lasers, having the structure of FIG. 4, in manufacturing a semiconductor laser device capable of processing signals from a plurality of lines, simultaneously.

On the other hand, a considerable loss of laser beams occurs at bent portions of the semiconductor laser device. Such a considerable loss of laser beams occurs at the block, since it is impossible to align the center of semiconductor laser chip with the core of the optical cable by the block. As a result, an accurate signal transmission cannot be achieved.

In addition, the structure of FIG. 4 is not economical because the block is needed to couple the semiconductor laser chip with external elements.

Second, the semiconductor laser device shown in FIG. 5 will be described. In manufacturing the illustrated semiconductor laser device, a semiconductor laser chip is formed on a substrate. Then, a guide cavity is formed on the substrate. In the guide cavity, the semiconductor laser chip is coupled with an optical cable. The optical cable and the substrate disposed in the guide cavity is molded with an epoxy resin material to prevent laser beam losses.

In this structure, however, one substrate accommodates only a single semiconductor laser chip which processes a signal from a single line, similar to the structure of FIG. 4. As a result, it is impossible to form a plurality of semiconductor laser chips on a single substrate. This makes mass production of semiconductor lasers difficult.

Similar to the case of FIG. 4, it is impossible to integrate a plurality of semiconductor lasers having the structure of FIG. 5 in manufacturing a semiconductor laser device capable of processing signals from a plurality of lines, simultaneously.

SUMMARY OF THE INVENTION

Therefore, an object of the invention is to overcome the above-mentioned problems encountered in the prior art and to provide a semiconductor laser capable of having an integrated structure and capable of processing signals from a plurality of lines simultaneously, and a method for manufacturing the same.

Another object of the invention is to provide a semiconductor laser capable of being easily coupled with external elements and a method for manufacturing the same.

In one aspect, the present invention provides a semiconductor laser comprising: a compound semiconductor substrate of a first conductivity type; a semiconductor laser chip region defined at a center portion of an upper portion of the substrate and provided at its front and bottom surfaces with mirror surfaces for oscillating laser beams, the chip region having a shape of a hexahedron; a pair of guide regions defined at opposite sides of the chip region, respectively, to be in contact with the semiconductor laser chip region, the guide regions defining a cavity for coupling the chip region with external elements, at the substrate, together with front and rear surface of the chip region; a first electrode formed over the chip region and guide regions and adapted to receive an electric power for generating laser beams; and a second electrode formed beneath the semiconductor substrate and adapted-to receive the electric power for generating laser beams, together with the first electrode.

In another aspect, the present invention provides a method for manufacturing a semiconductor laser comprising the steps of: preparing a compound semiconductor substrate of a first conductivity type; patterning an upper surface of the substrate to form a ridge having a predetermined width and a predetermined height at a center portion of the upper surface; forming a first compound semiconductor layer of a second conductivity type over respective portions of the upper surface of the substrate disposed at opposite sides of the ridge, the first compound semiconductor layer having a height substantially identical to the height of the ridge; forming a second compound semiconductor layer of the second conductivity type over the entire surface of the ridge and the first compound semiconductor; patterning the second compound semiconductor layer to form a cavity having a predetermined width and extending in a direction perpendicular to the ridge; forming a third compound semiconductor layer of the first conductivity type as a clad layer extending up to a level higher than an upper surface of the second compound semiconductor layer to fill the cavity sufficiently; forming a fourth compound semiconductor layer of an undoped type as an active layer over the third compound semiconductor layer; forming a fifth compound semiconductor layer of the second conductivity type as another clad layer over the fourth compound semiconductor layer to obtain a multi-layered structure; forming a first electrode and a second electrode over the fifth compound semiconductor layer and beneath the substrate, respectively, the electrodes being adapted to apply an electric power to the semiconductor laser; defining a center portion of the multi-layered structure as a chip region and defining opposite portions of the multilayered structure disposed at opposite sides of the chip region, respectively, as guide regions, the center portion including the cavity; partially removing the first to the fifth compound semiconductor layers and the first electrode at portions disposed at opposite side portions of the chip region and each having a width extending from each corresponding edge of the cavity to each corresponding edge of the ridge, to separate the chip region from the guide regions except portions at which the ridge is disposed; and partially removing the first electrode and the first to the fifth compound semiconductor layers disposed within the chip region, except for portions disposed over the ridge, to form a semiconductor laser chip.

BRIEF DESCRIPTION OF THE DRAWINGS

Other objects and aspects of the invention will become apparent from the following description of embodiments with reference to the accompanying drawings, in which.

DETAILED DESCRIPTION OF THE PREFERRED EMBODIMENTS

Illustrated in FIGS. 6a to 6i and FIGS. 7a to 7i, are the sequential steps of a method of making a semiconductor laser in accordance with the present invention.

Figure 6A:
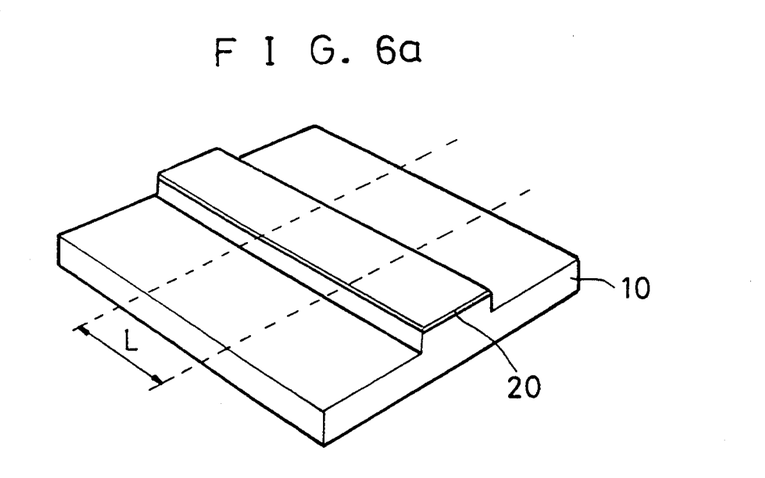
FIGS. 6a to 6i are sectional views illustrating a method for manufacturing a semiconductor laser in accordance with the present invention.

First, in accordance with the method, on an n-type GaAs substrate 10 with a thickness of about 370 um, a film 20 made of Si$_3$N$_4$ is deposited to a thickness of 1,000 A to 2,000 A, as shown in FIG. 6a. The Si$_3$N$_4$ film 20 is formed on the center portion of the upper surface of GaAs substrate 10 using a chemical vapor deposition (CVD) method and is in a form of a strip with a predetermined width. In place of Si$_3$N$_4$, the film 20 may be made of SiO$_2$.

Thereafter, the upper surface of n-type GaAs substrate 10 is subjected to a patterning for forming a ridge having a predetermined width and a predetermined height at the center portion thereof. For example, the n-type GaAs substrate 10 is wet-etched to the depth of 0.8 um to 1.0 um using the Si$_3$N$_4$ film 20 as a mask to form a ridge having a thickness of 0.8 um to 1.0 um at the center portion of its upper surface. The width of the ridge is substantially identical to the width of Si$_3$N$_4$ film 20, which is used as the mask upon the formation of the ridge, and may be 30 um, 50 um or 100 um. The wet-etching process for forming the ridge is carried out in a solution of NH$_4$OH: H$_2$O$_2$: H$_2$O (1:1:500) for 20 to 30 minutes.

Figure 7A:
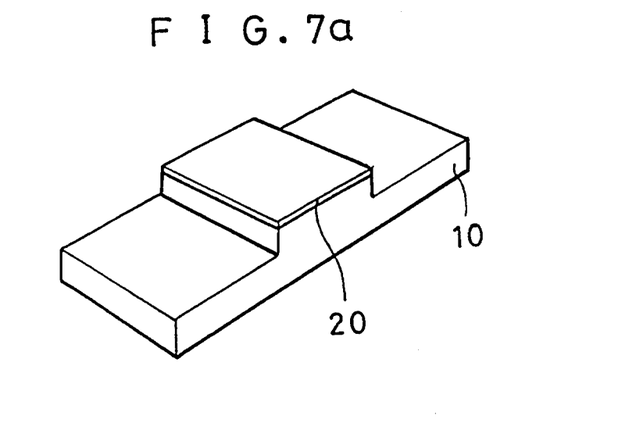
FIGS. 7a to 7i are enlarged perspective views of "L" portions of FIGS. 6a to 6i, respectively.

FIG. 7a is an enlarged view of portion "L" of FIG. 6a.

Figure 6B:
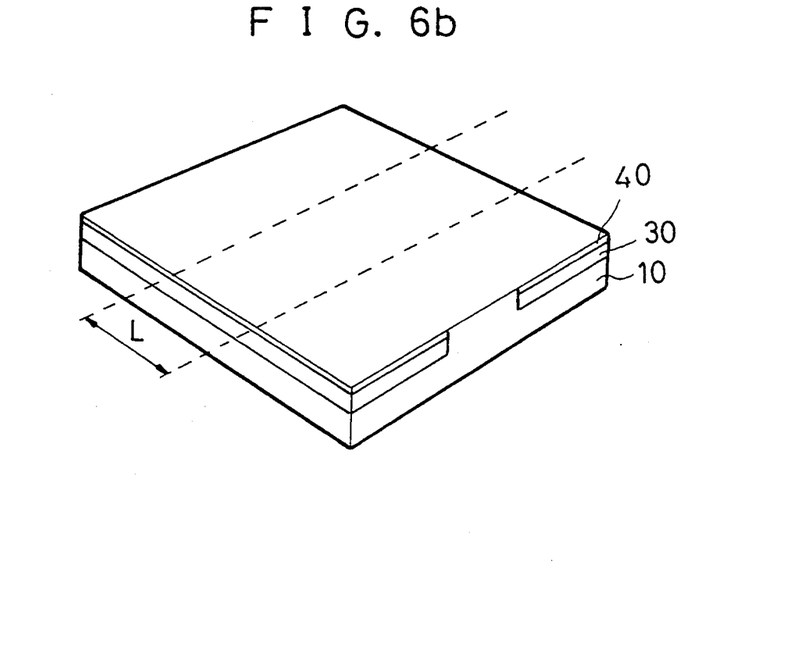

Over the wet-etched portions of n-type GaAs substrate 10 disposed at opposite sides of the ridge, a p-type GaAlAs film 30 (having an Al content of not less than 0.4) and a p-type GaAs film 40 are epitaxially grown in this order, using a metal organic chemical vapor deposition (MOCVD) method, as shown in FIG. 6b. The upper surface of p-type GaAs film 40 is flush with the upper surface of the ridge. That is, the sum of the thicknesses of the p-type GaAlAs film 30 and p-type GaAs film 40 is the same as the thickness of the ridge.

Although one set of the p-type GaAlAs film 30 and p-type GaAs film 40 is formed to have a total thickness corresponding to the thickness of the ridge in the illustrated embodiment, several sets of alternating thinner p-type GaAlAs film 30 and thinner p-type GaAs film 40 may be formed to have the same total thickness corresponding to the thickness of the ridge. Alternatively, only one of the p-type GaAlAs film 30 and p-type GaAs film 40 may be formed to have a thickness corresponding to the thickness of the ridge.

In place of MOCVD, the epitaxial growth of the p-type GaAlAs film 30 and p-type GaAs film 40 may be achieved using a liquid phase epitaxy (LPE) method or a molecular beam epitaxy (MBE) method.

Thereafter, the Si$_3$N$_4$ film 20, used as the etching mask upon the formation of the ridge, is removed. As a solution for removing the Si$_3$N$_4$ film 20, a buffered HF (BOE) solution is used.

Figure 7B:
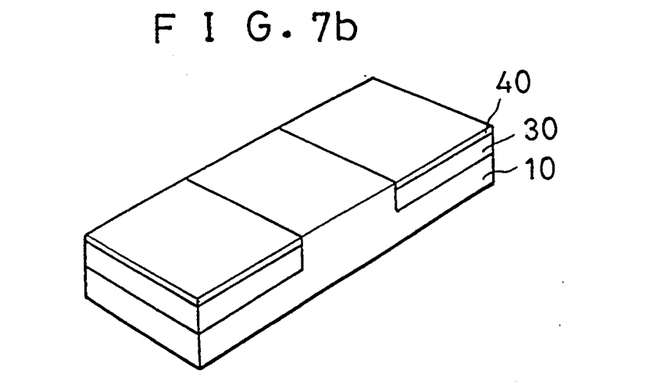

FIG. 7b is an enlarged view of portion "L" of FIG. 6b.

Figure 6C:
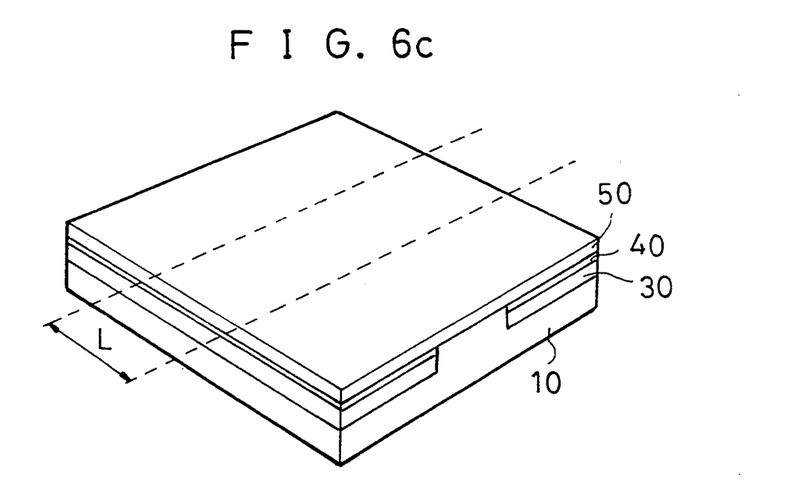

As shown in FIG. 6c, a p-type GaAs film 50 with a thickness of 1 um is epitaxially grown over the resultant, entirely exposed upper surface, that is, the upper surface of the ridge and the upper surface of p-type GaAs film 40. The epitaxial growth of the p-type GaAs film 50 may be achieved using one of MOCVD, MBE and LPE methods.

Figure 7C:
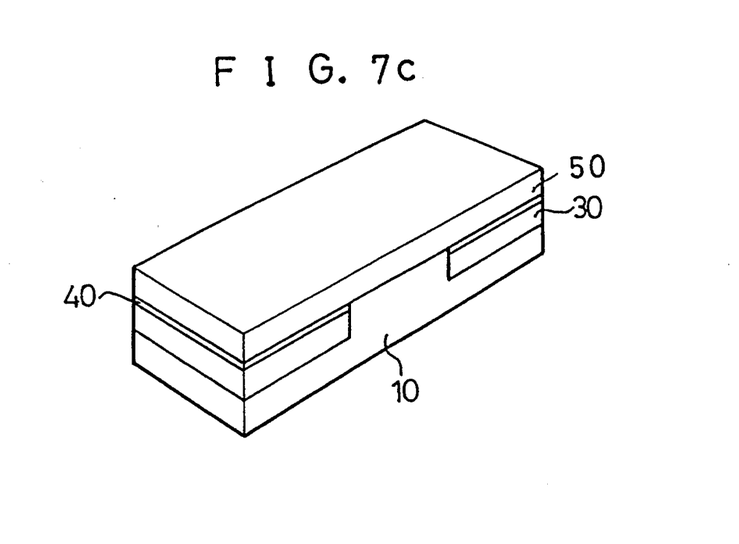

FIG. 7c is an enlarged view of portion "L" of FIG. 6c.

Figure 6D:
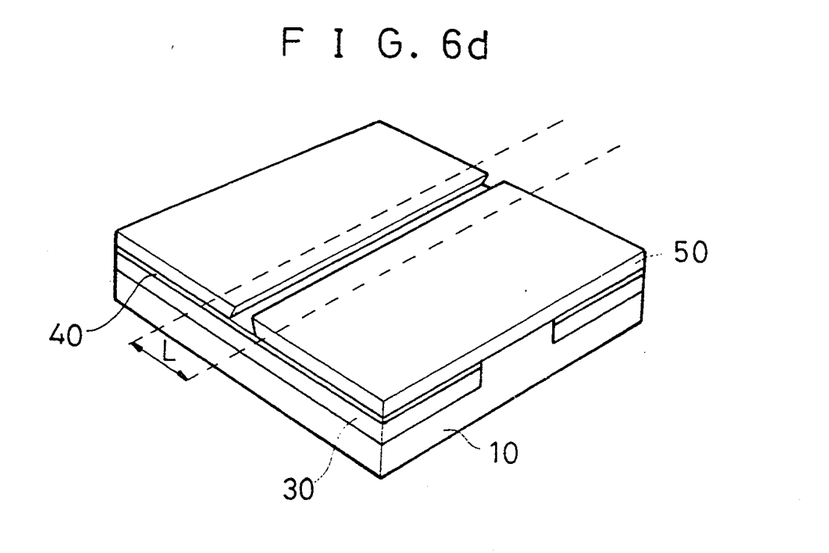

Subsequently, the p-type GaAs film 50 is subjected at its center portion to a wet-etching so that a cavity is formed to extend in a direction perpendicular to the ridge disposed beneath the cavity, as shown in FIG. 6d. The formed cavity has a width of 4 um to 10 um and a depth of 1 um corresponding to the thickness of p-type GaAs film 50.

The wet-etching for forming the cavity is carried out in a solution of C$_2$H$_4$(OH)$_2$: H$_2$O$_2$: H$_2$SO$_4$ (7:2:1) for approximately 60 seconds.

Figure 7D:
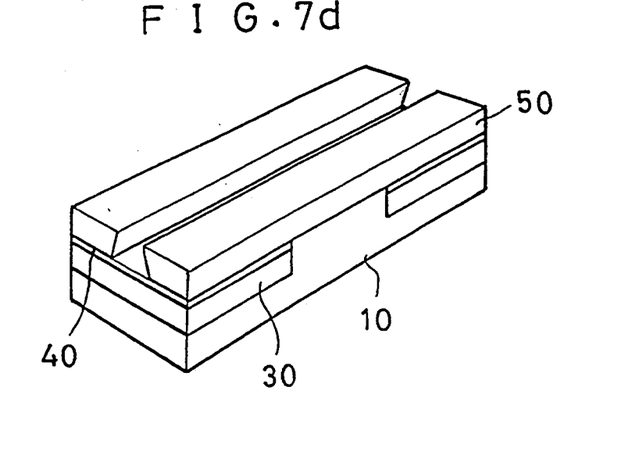

FIG. 7d is an enlarged view of portion "L" of FIG. 6d.

Figure 6E:
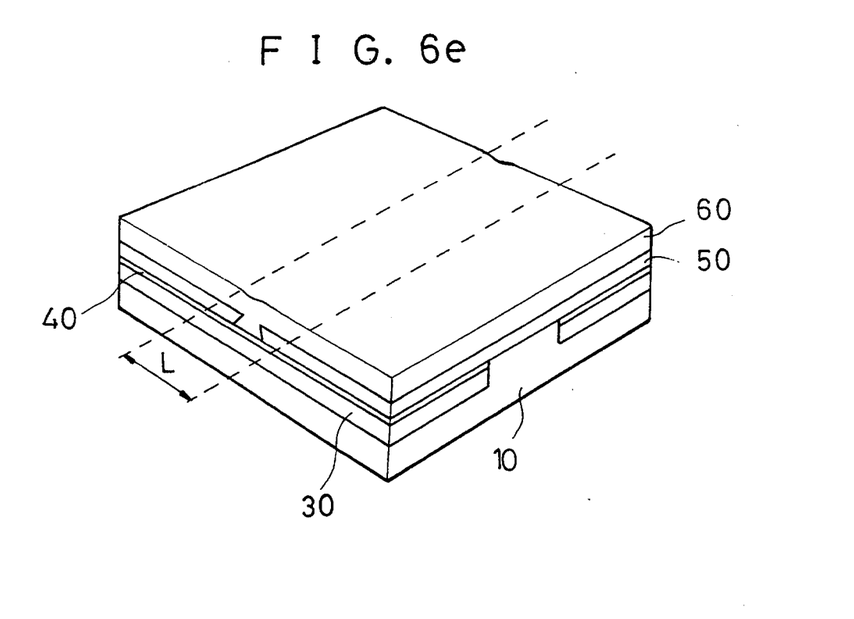

Over the upper surface of p-type GaAs film 50, a double hetero (DH) layer 60 is formed having a thickness of 5 um, as shown in FIG. 6e. The DH layer 60 comprises an n-type GaAlAs film 60a as an n-type clad layer formed to a level higher than the upper surface of p-type GaAs film 50 so as to fill the cavity sufficiently, an undoped GaAlAs film 60b as an active layer formed over the n-type GaAlAs film 60a, and a p-type GaAlAs film 60c as a p-type clad layer formed over the GaAlAs film 60b. The DH structure has been described hereinbefore, and thus, its further description will be omitted.

With this structure, upon applying electric power for generating laser beams, electrons concentrate at the n-type GaAlAs 60a as the n-type clad layer of the DH layer through the surface of the ridge exposed to the cavity.

Figure 7E:
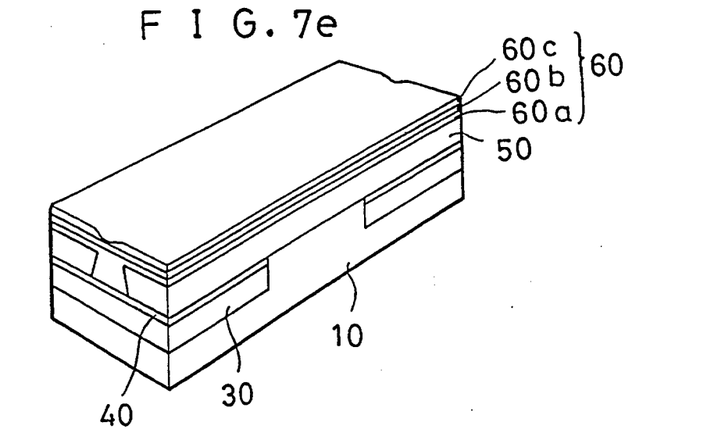

FIG. 7e is an enlarged view of portion "L" of FIG. 6e.

To apply electric power for generating laser beams, a first electrode 70 and a second electrode 80 are formed at the upper surface of DH layer 60 and the lower surface of n-type GaAs substrate 10, respectively, using the CVD method. A metal or a polysilicon doped with n or p-type impurity may be used as the material of the electrodes 70 and 80.

Figure 6F:
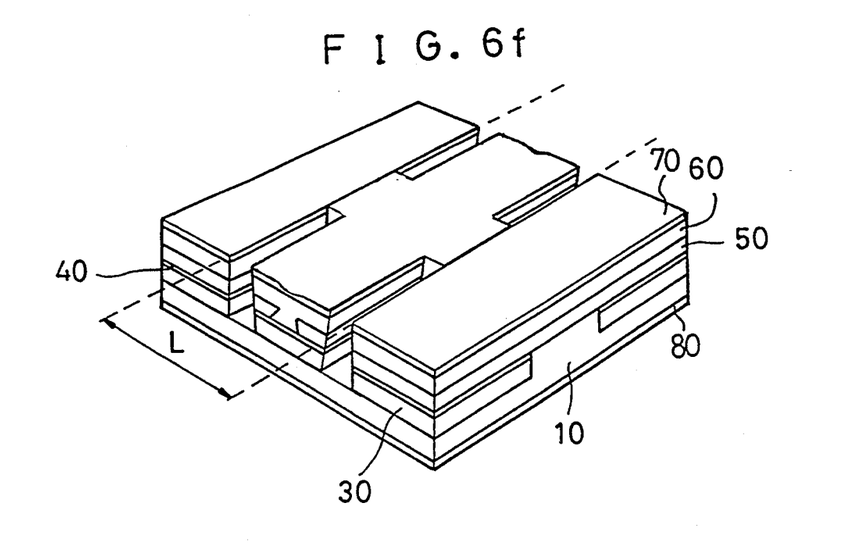

Thereafter, a semiconductor laser chip region is defined at the center portion of the resultant, entirely exposed upper surface. Guide regions for coupling a semiconductor laser chip with optical signal transfer lines or light receiving elements are also defined at portions of the upper surface disposed at opposite sides of the chip region. Subsequently, the first electrode 70, the DH layer 60, the p-type GaAs film 50, the p-type GaAs film 40, and the p-type GaAlAs film 30 are partially removed at the portions disposed at opposite side portions of the chip region and having a width extending from each edge of the cavity and each edge of the ridge, as shown in FIG. 6f. Accordingly, the chip region is partially separated from the guide regions.

In the illustrated embodiment, the length of a resonator for increasing the generated laser beams is identical to the length of the chip region, that is, the width of the ridge.

The removal of the first electrode 70, DH layer 60, the p-type GaAs film 50, p-type GaAs film 40, and p-type GaAlAs film 30 is carried out according to the wet-etching method.

Figure 7F:
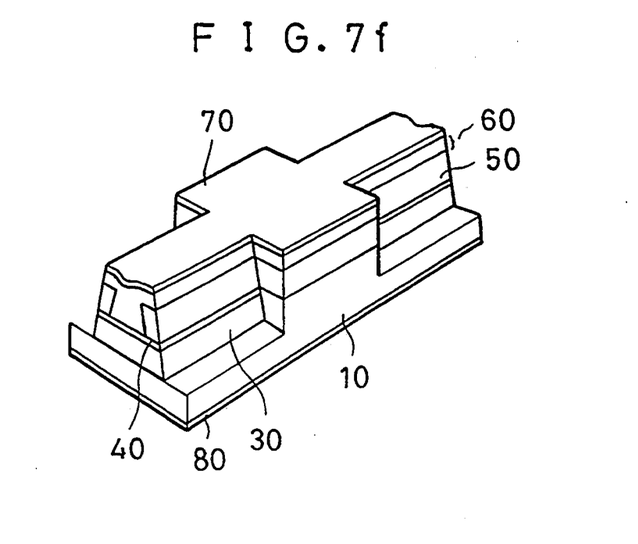

FIG. 7f is an enlarged view of portion "L" of FIG. 6f.

Figure 6G:
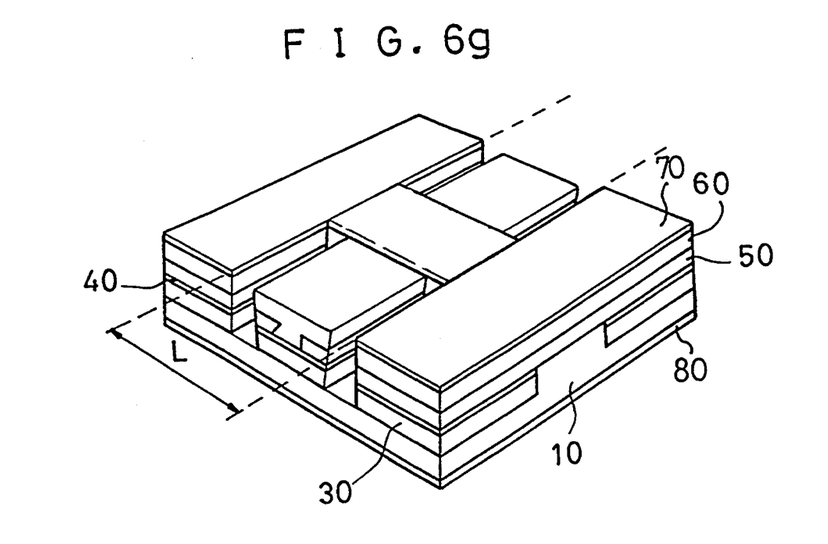

As shown in FIG. 6g, the first electrode 70 is then subjected to a wet-etching process to remove portions of the first electrode 70, not including portions disposed over the ridge.

Figure 7G:
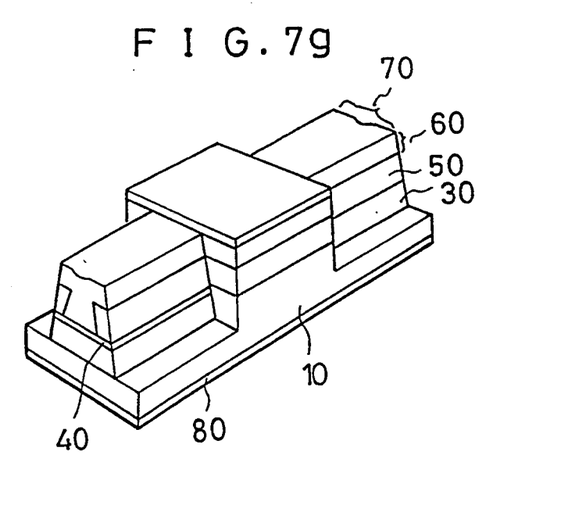

FIG. 7g is an enlarged view of portion "L" of FIG. 6g.

Figure 6H:
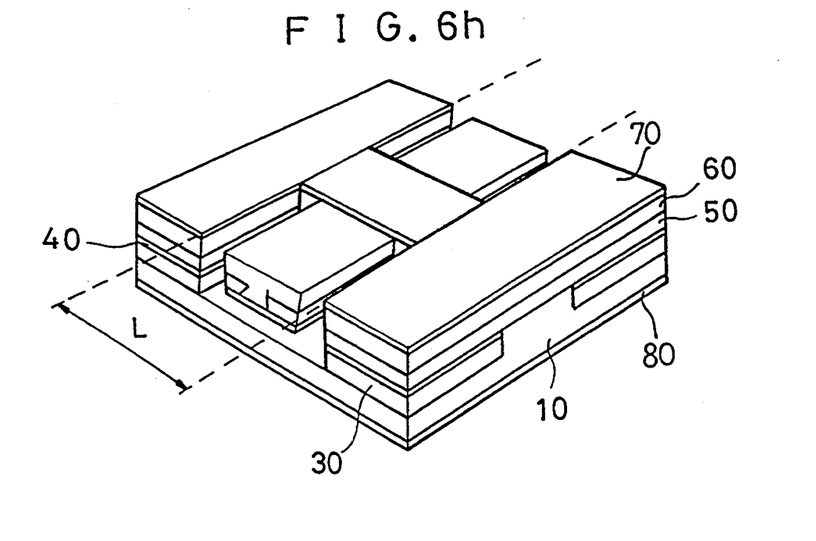

Thereafter, respective portions of p-type GaAlAs layer 30 disposed at opposite sides of the ridge within the chip region are selectively removed using an HF solution maintained at a temperature of approximately 80° C., as shown in FIG. 6h.

As a result, the DH layer 60, p-type GaAs film 50, and p-type GaAs layer 40 are isolated from the n-type GaAs substrate 10 within the chip region except at the ridge portions. That is, they are in contact with the front and rear surfaces of the resonator.

The DH layer 60, p-type GaAs film 50, and p-type GaAs layer 40 in contact with the front and rear surfaces of the resonator should be removed to provide mirror surfaces for an oscillation of laser beams at the front and rear surfaces of the resonator.

A cleaving method utilizing a dry or wet-etching technique has been conventionally used as a method for removing the layers. However, this cleaving method is undesirable because it is likely to reduce the predetermined length of the resonator. Also, it cannot provide smooth mirror surfaces at the front and rear surfaces of the resonator.

Figure 6I:
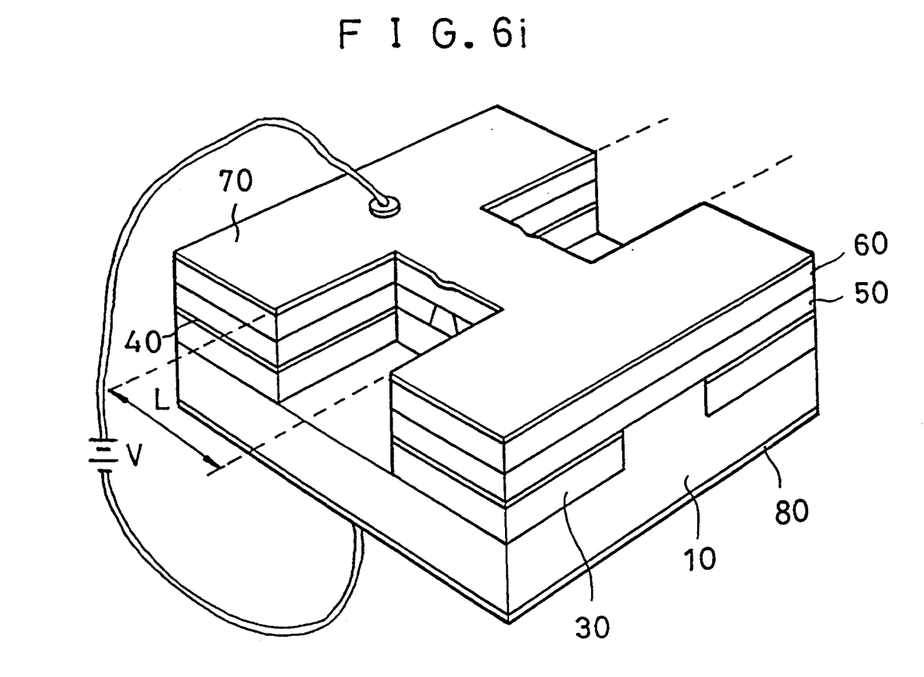

In accordance with the present invention, the DH layer 60, p-type GaAs film 50, and p-type GaAs layer 40 are partially subjected, at the portions disposed over the ridge, to an application of ultrasonic wave energy to remove respectively unnecessary portions of DH layer 60, p-type GaAs film 50, and p-type GaAs layer 40 in contact with the front and rear surfaces of the resonator, as shown in FIG. 6i. Accordingly, it is possible to obtain the predetermined length of the resonator and smooth surfaces.

Herein, "the resonator" means opposite side surfaces of the DH layer 60 disposed over the ridge and which prevent laser beams from passing therethrough causing the laser beams to oscillate.

In FIG. 6i, the reference character V denotes an electric power (voltage) source connected between the first electrode 70 and the second electrode 80, for generating laser beams.

Figure 7H:
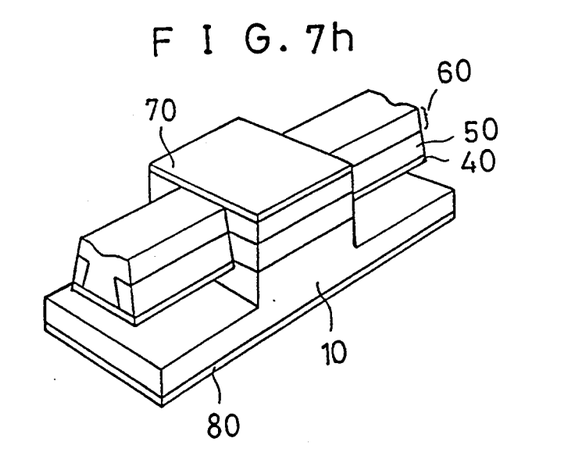
Figure 7I:
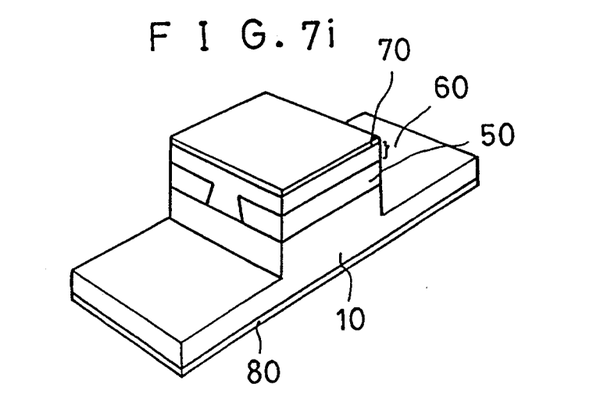

FIGS. 7h and 7i are enlarged views of "L" portions of FIG. 6h and 6i, respectively.

Although GaAs and GaAlAs are used as compound semiconductor materials in the illustrated embodiment, InP and InGaAsP may be substituted for GaAs and GaAlAs, respectively.

The present invention provides the following effects.

First, it is easy to couple the semiconductor laser with external signal transfer lines, such as light receiving elements and optical cables, because each semiconductor laser chip of the present invention is equipped with guide regions.

Second, each semiconductor laser chip can be minimized in size to correspond to the width of the ridge, thereby enabling the size of the active layer to be minimized. Accordingly, it is possible to restrain carriers (electrons and holes) and laser beams in the active region with a small size, that is, small width and length, and thus, greatly reducing the threshold current, for example, to 75 mA or below.

Third, it is possible to manufacture the semiconductor laser in mass quantity in which a single substrate has guide regions for coupling external elements or optical communication cables to the semiconductor laser.

Fourth, a plurality of optical signals can be simultaneously processed, because a plurality of semiconductor laser chips are provided for a single substrate. Accordingly, the semiconductor laser according to the present invention is advantageous when it is applied, for example, in the optical communication field.

Although the preferred embodiments of the invention have been disclosed for illustrative purpose, those skilled in the art will appreciate that various modifications, additions and substitutions are possible, without departing from the scope and spirit of the invention as disclosed in the accompanying claims.

What is claimed is:

1. A method for manufacturing a semiconductor laser comprising the steps of:

preparing a compound semiconductor substrate of a first conductivity type;

patterning an upper surface of the substrate to form a ridge at a center portion of the upper surface;

forming a first compound semiconductor layer of a second conductivity type and a second compound semiconductor layer of a second conductivity type over respective portions of the upper surface of the substrate disposed at opposite sides of the ridge, the first compound semiconductor layer and the second compound semiconductor layer having same heights as the ridge;

forming another second compound semiconductor layer on an entire surface of the ridge and the second compound semiconductor;

patterning the another second compound semiconductor layer to form a cavity extending in a direction perpendicular to the ridge;

forming a third compound semiconductor layer of the first conductivity type as a clad layer above an upper surface of the another second compound semiconductor layer, the cavity being filled sufficiently by the third compound semiconductor layer;

forming a fourth compound semiconductor layer of an undoped type as an active layer over the third compound semiconductor layer;

forming a fifth compound semiconductor layer of the second conductivity type, as another clad layer, over the fourth compound semiconductor layer to obtain a multi-layered structure;

forming a first electrode and a second electrode over the fifth compound semiconductor layer and beneath the substrate, respectively, the electrodes being adapted to apply an electric power received from a power source to the semiconductor laser;

defining a center portion of the multi-layered structure as a chip region and defining opposite portions of the multilayered structure disposed at opposite sides of the chip region, respectively, as guide regions, the center portion including the cavity;

partially removing the first to the fifth compound semiconductor layers and the first electrode at portions disposed at opposite sides of the chip region, each portion extending from each corresponding edge of the cavity to each respective corresponding edge of the ridge, to partially separate the chip region from the guide regions; and further partially removing the first electrode and the first to the fifth compound semiconductor layers disposed within the chip region, leaving intact the portions of the first electrode and the first to the fifth compound semiconductor layers disposed over the ridge, to form a semiconductor laser chip.

2. A method for manufacturing a semiconductor laser in accordance in claim 1, further comprising the step of connecting an electric power source between the first and second electrodes, the electric power source being adapted to generate laser beams.

3. A method for manufacturing a semiconductor laser in accordance with claim 1, wherein the substrate, the second compound semiconductor layer, and the another second compound semiconductor layer comprise GaAs and the first compound semiconductor and the third to the fifth compound semiconductor layers comprise GaAlAs.

4. A method for manufacturing a semiconductor laser in accordance with claim 1, wherein the substrate, the second compound semiconductor layer, and the another second compound semiconductor layer comprise InP and the first compound semiconductor and the third to the fifth compound semiconductor layers comprise InGaAsP.

5. A method for manufacturing a semiconductor laser in accordance with claim 1, wherein the first and second electrodes comprise one of a metal and a polysilicon doped with an impurity.

6. A method for manufacturing a semiconductor laser in accordance with claim 1, wherein the step of forming the ridge comprises the steps of:
   forming an insulating film having a strip shape at the center portion of the upper surface of the substrate;
   wet-etching the substrate using the insulating film as an etching mask to remove substrate portions that are not covered with the insulating film; and
   removing the insulating film.

7. A method for manufacturing a semiconductor laser in accordance with claim 6, wherein the wet-etching step is carried out using a solution of $NH_4OH:H_2O_2:H_2O$ at a ratio of 1:1:500, respectively.

8. A method for manufacturing a semiconductor laser in accordance with claim 6, wherein the insulating film comprises one of $Si_3N_4$ and $SiO_2$.

9. A method for manufacturing a semiconductor laser in accordance with claim 6, wherein the wet-etching step is carried out using a buffered HF(BOE) solution.

10. A method for manufacturing a semiconductor laser in accordance with claim 1, wherein the step of forming the first compound semiconductor layer comprises the step of forming a multi-layered structure comprising a layer of the second conductivity type having a thickness smaller than that of the entire first compound semiconductor layer and a sixth compound semiconductor layer of the second conductivity type.

11. A method for manufacturing a semiconductor laser in accordance with claim 10, wherein the sixth compound semiconductor layer comprises GaAs.

12. A method for manufacturing a semiconductor laser in accordance with claim 10, wherein the first and sixth compound semiconductor layers are epitaxially grown according to one of a metal organic chemical vapor deposition method, a liquid phase epitaxy method and a molecular beam epitaxy method.

13. A method for manufacturing a semiconductor laser in accordance with claim 1, wherein the step of forming the cavity comprises the step of wet-etching the another second compound semiconductor layer using a solution of $C_2H_4(OH_2:H_2O_2: H_2SO_4$ at a ration of 7:2:1, respectively.

14. A method for manufacturing a semiconductor laser in accordance with claim 1, wherein the ridge has a width identical to a desired length of a resonator.

15. A method for manufacturing a semiconductor laser in accordance with claim 1, wherein the step of partially removing the first electrode and the first to the fifth compound semiconductor layers disposed within the chip region, leaving intact the portions of the first electrode and the first to the fifth compound semiconductor layers disposed over the ridge, to form a semiconductor laser chip, comprises the steps of:
   wet-etching the first electrode disposed within the chip region to partially remove the first electrode;
   wet-etching the first compound semiconductor layer disposed within the chip region to partially remove the first compound semiconductor layer; and
   partially removing the second to the fifth compound semiconductor layers disposed within the chip region using ultrasonic wave energy.

16. A method for manufacturing a semiconductor laser in accordance with claim 15, wherein the wet-etching step for removing the first compound semiconductor layer is carried out using a HF solution maintained at a temperature of approximately 80° C.

17. A method for manufacturing a semiconductor laser in accordance with claim 1, wherein the first recited partially removing step leaves intact the connection between the chip region and the guide regions at the ridge.

18. A method for manufacturing a semiconductor laser in accordance with claim 1, wherein the ridge has a width approximately in the range of 30 μm to 100 μm and a thickness approximately in the range of 0.8 μm to 1.0 μm.

19. A method for manufacturing a semiconductor laser in accordance with claim 1, wherein the cavity has a width approximately in the range of 4 μm to 10 μm and a depth of approximately 1 μm.

* * * * *

UNITED STATES PATENT AND TRADEMARK OFFICE
CERTIFICATE OF CORRECTION

PATENT NO. : 5,346,854
DATED : September 13, 1994
INVENTOR(S) : Hyung S. AHN and Won T. CHOI It is certified that error appears in the above-indentified patent and that said Letters Patent is hereby corrected as shown below:

Claim 13, column 10, line 7, "ration" should read --ratio--.

Signed and Sealed this

Twenty-eight Day of February, 1995

Attest:

BRUCE LEHMAN

Attesting Officer     Commissioner of Patents and Trademarks